United States Patent
Diaz

(10) Patent No.: US 7,411,986 B2
(45) Date of Patent: Aug. 12, 2008

(54) OPTICAL SYSTEM LASER DRIVER WITH A BUILT IN OUTPUT INDUCTOR FOR IMPROVED FREQUENCY RESPONSE

(75) Inventor: Nelson Diaz, Westminster, CO (US)

(73) Assignee: Finisar Corporation, Sunnyvale, CA (US)

( * ) Notice: Subject to any disclaimer, the term of this patent is extended or adjusted under 35 U.S.C. 154(b) by 146 days.

(21) Appl. No.: 10/808,952

(22) Filed: Mar. 25, 2004

(65) Prior Publication Data
US 2005/0213622 A1    Sep. 29, 2005

(51) Int. Cl.
*H01S 3/13* (2006.01)
(52) U.S. Cl. .............. 372/38.02; 372/38.07; 372/38.1; 372/29.015
(58) Field of Classification Search .............. 372/38.02, 372/38.1, 38.07, 29.015
See application file for complete search history.

(56) References Cited

U.S. PATENT DOCUMENTS

| 4,594,717 A | 6/1986 | Bracht et al. |
| 5,883,910 A | 3/1999 | Link |
| 6,560,258 B1 | 5/2003 | McQuilkin |
| 2002/0064193 A1* | 5/2002 | Diaz et al. ............ 372/26 |
| 2003/0002551 A1* | 1/2003 | Kwon et al. ........... 372/38.02 |
| 2003/0035451 A1 | 2/2003 | Ishida et al. |
| 2003/0043869 A1 | 3/2003 | Vaughan |
| 2003/0086456 A1* | 5/2003 | Tatehara et al. ........ 372/38.02 |
| 2003/0138008 A1* | 7/2003 | Riaziat et al. ........... 372/36 |
| 2005/0276290 A1* | 12/2005 | Preisach .............. 372/38.02 |

* cited by examiner

*Primary Examiner*—Minsun Harvey
*Assistant Examiner*—Tod T Van Roy
(74) *Attorney, Agent, or Firm*—Workman Nydegger

(57) ABSTRACT

A laser driver comprises a PNP transistor current source, an inductor coupled to the PNP transistor current source, a switch coupled to the inductor, and a current sink coupled to the switch. The PNP transistor current source supplies a first current to a laser if the switch is closed and a second current to the laser if the switch is open. The PNP transistor current source, inductor, switch, and current sink are on a single semiconductor chip.

13 Claims, 5 Drawing Sheets

OPTICAL SYSTEM LASER DRIVER WITH A BUILT IN OUTPUT INDUCTOR FOR IMPROVED FREQUENCY RESPONSE

BACKGROUND

Fiber optic transceivers are used in a variety of applications, including storage area networks (SANs), local area networks (LANs), Fibre Channel, Gigabit Ethernet, and synchronous optical networks (SONET) applications. Fiber optic transceivers can be used as the network interface in mainframe computers, workstations, servers, and storage devices. Fiber optic transceivers can also be used in a broad range of network devices, such as bridges, routers, hubs, and local and wide area switches.

Fiber optic transceivers include a fiber optic receiver and a fiber optic transmitter. The fiber optic receiver converts optical serial data to electrical serial data and the fiber optic transmitter converts electrical serial data to optical serial data. A majority of fiber optic transceivers include power control circuits, diagnostic circuits, and other circuits for enhancing the functionality of the fiber optic transceivers.

Fiber optic transmitters include a laser driver and a transmitter optical subassembly (TOSA). Laser drivers provide a bias current and a modulation current to a laser to control the optical output power of the laser. Typically, laser drivers control the bias and modulation currents over temperature and as the laser ages to maintain constant output power of the laser. Laser drivers can be single ended or differential. A single ended laser driver provides the modulation current and the bias current to one side of a laser with the other side of the laser coupled to a common or ground. For a differential laser driver, both sides of the laser are coupled to the laser driver circuit.

SUMMARY

One embodiment of the present invention provides a laser driver. The laser driver comprises a PNP transistor current source, an inductor coupled to the PNP transistor current source, a switch coupled to the inductor, and a current sink coupled to the switch. The PNP transistor current source supplies a first current to a laser if the switch is closed and a second current to the laser if the switch is open. The PNP transistor current source, inductor, switch, and current sink are on a single semiconductor chip.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
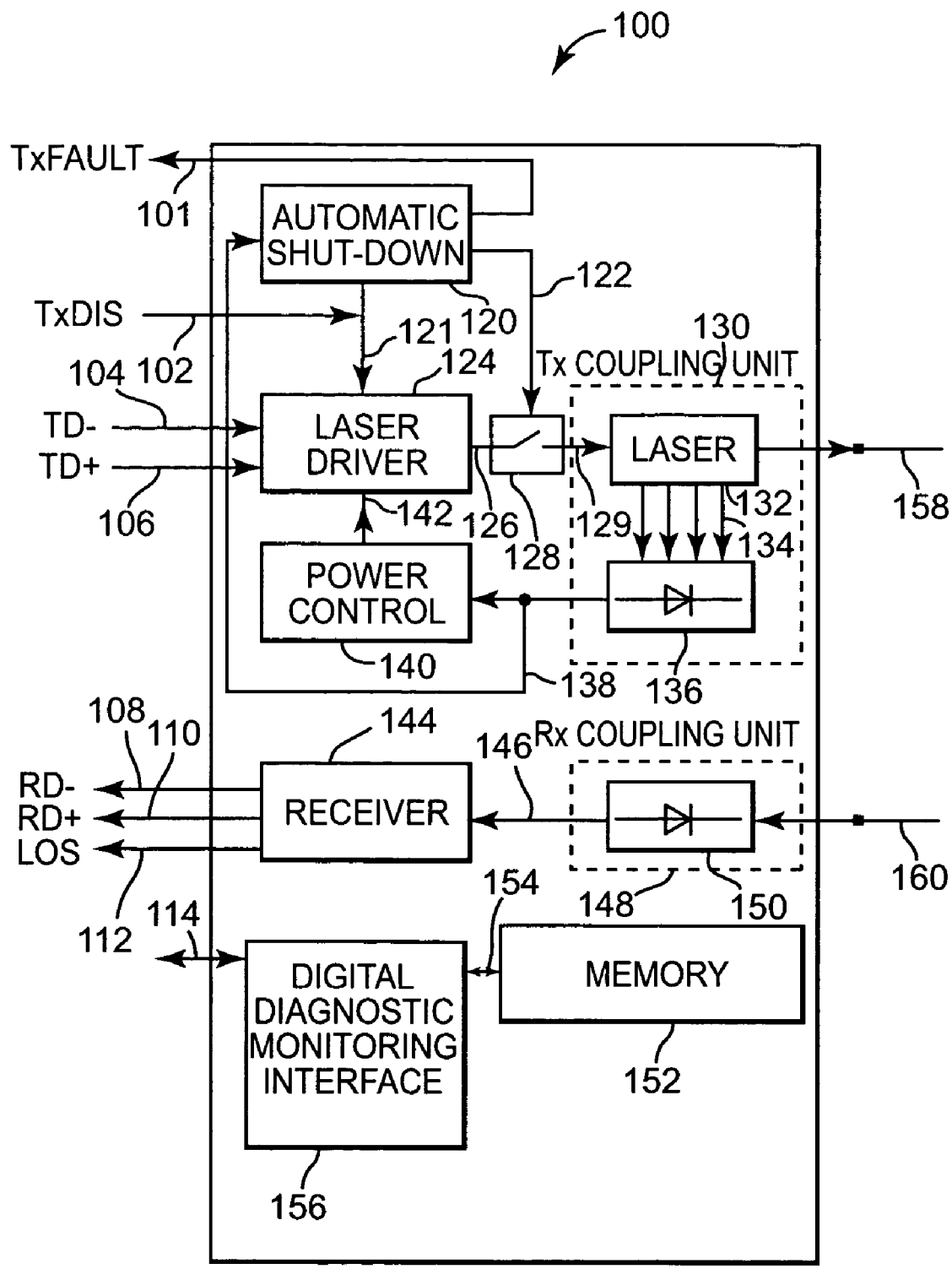
FIG. 1 is a block diagram illustrating one embodiment of a transceiver.

FIG. 1 is a block diagram illustrating one embodiment of a transceiver 100. Transceiver 100 includes an automatic shutdown circuit 120, a laser driver 124, a switch 128, a transmitter (Tx) coupling unit 130, a power control circuit 140, a receiver 144, a receiver (Rx) coupling unit 148, a digital diagnostic monitoring interface 156, and a memory 152. The Rx coupling unit 148 includes a photodiode 150. The Tx coupling unit 130 includes a laser diode 132 and a monitor diode 136.

Laser driver circuit 124 drives the modulation and bias currents of laser diode 132. The currents are controlled by power control circuit 140 to provide constant output power of laser diode 132 over varying temperatures and as the laser diode 132 ages. Laser driver circuit 124 includes a PNP current source coupled to an inductor to provide the modulation and bias currents. The inductor increases the frequency response of the PNP current source. The inductor can be sized to achieve the desired frequency response and to reduce the intersymbol interference of the optical output of the laser to a desired level. Laser driver circuit 124 supplies a single ended signal or a differential signal to laser 132. Power control circuit 140 uses the output of monitor diode 136 as a control signal to prevent the laser power from exceeding operating limits.

The automatic shutdown circuit 120, laser driver 124, switch 128, Tx coupling unit 130, and power control circuit 140 are configured as a transmitter. Automatic shutdown circuit 120 is electrically coupled to laser driver 124 through path 121 and to switch 128 through path 122. Laser driver 124 is electrically coupled to switch 128 through path 126 and to power control circuit 140 through path 142. Switch 128 is electrically coupled to laser diode 132 through path 129 and laser diode 132 is optically coupled to monitor diode 136 through optical path 134. Monitor diode 136 is electrically coupled to power control circuit 140 and automatic shut down circuit 120 through path 138. Tx coupling unit 130 is coupled to fiber optic cable 158.

The receiver 144 and Rx coupling unit 148 are configured as a receiver. Receiver 144 is electrically coupled to photodiode 150 through path 146. Rx coupling unit 148 is coupled to a fiber optic cable 160. Digital diagnostic monitoring interface 156 is electrically coupled to memory 152 through path 154.

The host interface for transceiver 100 includes a transmitter fault (Tx Fault) signal line 101, a transmitter disable (Tx-Dis) signal line 102, a transmit data minus (TD−) signal line 104, and a transmit data plus (TD+) signal line 106. In addition, the host interface includes a receive data minus (RD−) signal line 108, a receive data plus (RD+) signal line 110, loss of signal (LOS) line 112, and a host communication line 114. In one embodiment, host communication line 114 includes a serial communication bus or other suitable communication bus.

Transmitter fault signal line 101 is electrically coupled to automatic shutdown circuit 120. Transmitter disable signal line 102 is electrically coupled to automatic shutdown circuit 120 and laser driver 124 through path 121. Transmit data minus signal line 104 and transmit data plus signal line 106 are electrically coupled to laser driver 124. Receive data minus signal line 108, receive data plus signal line 110, and loss of signal line 112 are electrically coupled to receiver 144, and host communication line 114 is electrically coupled to digital diagnostic and monitoring interface 156.

Rx coupling unit 148 mechanically and optically couples transceiver 100 to fiber optic cable 160. An optical signal transmitted by an external device is received by photodiode 150 and converted by photodiode 150 to an electrical signal. The electrical signal is passed to receiver 144 through path 146.

Receiver 144 converts the signal received from photodiode 150 into electrical serial data compatible with low voltage positive emitter coupled compatible logic (LVPECL). The LVPECL compatible electrical serial data is passed to a host through signal lines RD−108 and RD+110. The loss of signal on LOS signal line 112 indicates whether an optical signal is present at Rx coupling unit 148.

Monitoring diode 136 monitors the optical output of laser diode 132 through optical path 134. In one embodiment, monitoring diode 136 is mechanically built into Tx coupling unit 130. Monitoring diode 136 outputs a signal indicative of the output of laser diode 136 through path 138 to automatic shutdown circuit 120 and power control circuit 140.

Tx coupling unit 130 mechanically and optically couples transceiver 100 to fiber optic cable 158. Laser driver 124 receives a LVPECL compatible serial data signal from a host through TD− signal line 104 and TD+ signal line 106 and passes a signal to laser diode 132. Laser diode 132 converts the signal received from laser driver 124 into optical serial data and transmits the optical serial data through fiber optic cable 158.

Shutdown circuit 120 automatically disables laser diode 132 and outputs a fault signal on Tx Fault signal line 101 if shutdown circuit 120 detects a laser fault. By disabling laser diode 132, shutdown circuit 120 provides laser eye safety. Shutdown circuit 120 communicates with switch 128 through path 122 to open or close switch 128 to disable or enable laser diode 132.

In one embodiment, transceiver 100 includes a supervisory circuit for controlling the power supply. The supervisory circuit provides an internal reset signal whenever the supply voltage drops below a reset threshold. In one embodiment, the supervisory circuit keeps the reset signal active for at least 140 ms after the voltage has risen above the reset threshold. During this time, laser diode 132 is inactive.

A host can enable the laser driver 124 by providing a logic low level on TxDis signal line 102. A host can disable the laser driver 124 by providing a logic high level on TxDis signal line 102.

Digital diagnostic monitoring interface 156 continuously monitors transceiver 100 operating parameters. In one embodiment, transceiver 100 features internal calibration. Measurements are taken and transceiver 100 is calibrated over varying operating temperatures and voltages to obtain normal operating parameter ranges for transceiver 100. During operation, digital diagnostic monitoring interface 156 generates diagnostic data that is compared to the normal operating parameter ranges by digitizing internal analog signals monitored by a diagnostic integrated circuit (IC). The diagnostic IC has built in sensors that include alarm and warning thresholds. The threshold values are set during device manufacture and allow the user to determine when a particular value is outside of a normal operating parameter range.

Digital diagnostic monitoring interface 156 outputs alarm and warning flags to a host through host communication line 114. Alarm flags indicate conditions likely to be associated with an inoperational link that requires immediate action. Warning flags indicate conditions outside normal operating ranges, but not necessarily causes of immediate link failures.

Memory 152 is an electrically erasable programmable read-only memory (EEPROM). In other embodiments, other suitable memory types can be used. Memory 152 is used to store the operating parameters for transceiver 100.

Figure 2:
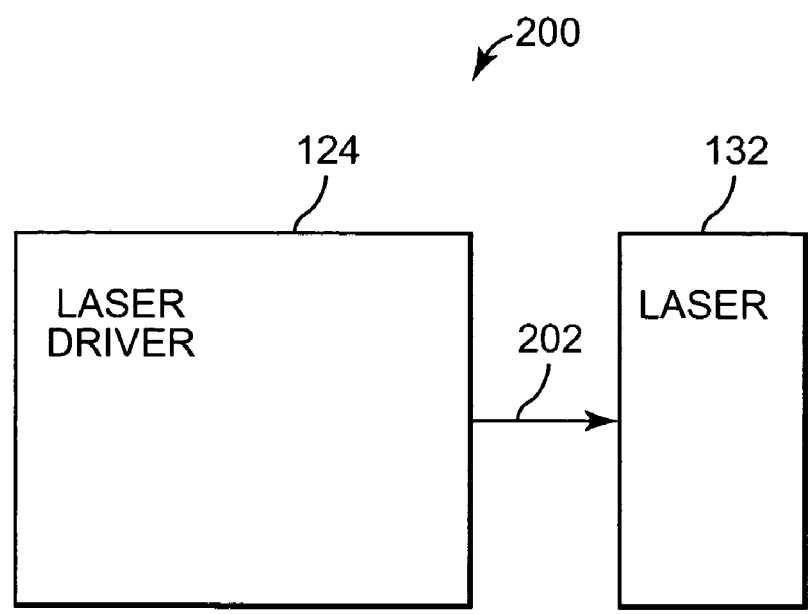
FIG. 2 is a block diagram illustrating one embodiment of a laser driver coupled to a laser.

FIG. 2 is a block diagram illustrating one embodiment of a portion 200 of transceiver 100. Portion 200 of transceiver 100 includes laser driver 124 coupled to laser 132 with switch 128 removed. Laser driver 124 is electrically coupled to laser 132 through path 202.

Laser driver 124 and laser 132 are configured as single ended or differential. For a single ended configuration, laser driver 124 supplies a signal to one side of laser 132 and the other side of laser 132 is coupled to a common or ground. For a differential configuration, laser driver 124 supplies a signal to both sides of laser 132. To output a logic high optical signal from laser 132, laser driver 124 supplies a modulation current and a bias current to laser 132. To output a logic low optical signal from laser 132, laser driver 124 supplies a bias current to laser 132.

Figure 3:
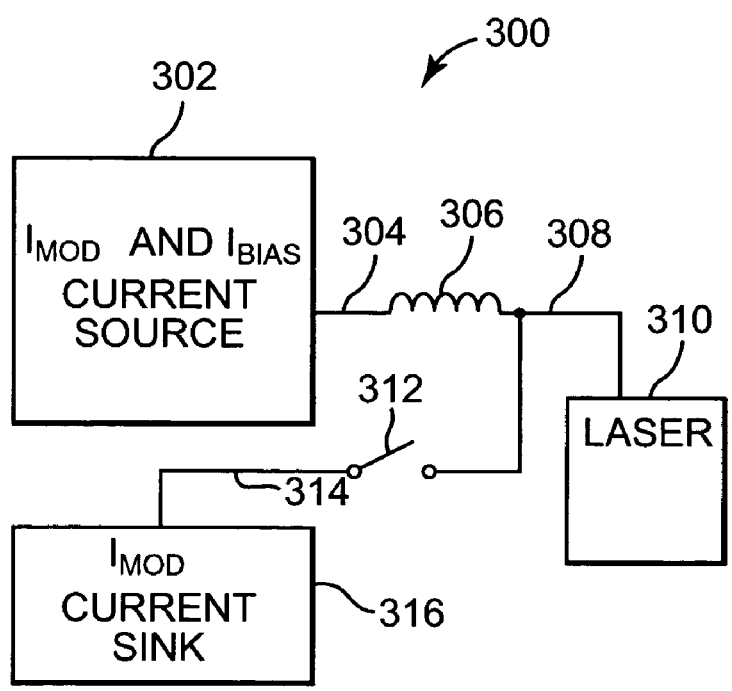
FIG. 3 is a diagram illustrating one embodiment of a single ended laser driver coupled to a laser.

FIG. 3 is a diagram illustrating one embodiment of a portion 300 of transceiver 100, including a single ended laser driver coupled to a laser. Portion 300 of transceiver 100 includes a modulation current ($I_{MOD}$) and bias current ($I_{BIAS}$) current source 302, an inductor 306, an $I_{MOD}$ current sink 316, a switch 312, and a laser 310. $I_{MOD}$ and $I_{BIAS}$ current source 302 is electrically coupled to inductor 306 through path 304. Inductor 306 is electrically coupled to laser 310 and to switch 312 through path 308. Switch 312 is electrically coupled to $I_{MOD}$ current sink 316 through path 314.

$I_{MOD}$ and $I_{BIAS}$ current source 302 includes a PNP transistor current source. $I_{MOD}$ and $I_{BIAS}$ current source 302 is selected based on the $I_{MOD}$ and $I_{BIAS}$ current requirements of laser 310. To increase the frequency response of $I_{MOD}$ and $I_{BIAS}$ current source 302, the signal from $I_{MOD}$ and $I_{BIAS}$ current source 302 passes through inductor 306 before the signal is passed to laser 310. Inductor 306 can be sized to achieve a desired frequency response and to reduce the intersymbol interference of the optical output of laser 310 to a desired level.

$I_{MOD}$ current sink 316 is selected based on the $I_{MOD}$ current requirements of laser 310. Switch 312 is an NPN transistor serving as a high speed switch or switch 312 is another suitable switch. Switch 312 switches on and off in response to a data signal. A logic low in the data signal closes switch 312 and a logic high in the data signal opens switch 312. Laser 310 outputs a logic low optical signal if switch 312 is closed and outputs a logic high optical signal if switch 312 is open. Laser 310 is a laser diode or other suitable laser.

In operation, if the data signal is a logic high, switch 312 is opened and both the $I_{MOD}$ and $I_{BIAS}$ currents from $I_{MOD}$ and $I_{BIAS}$ current source 302 pass through inductor 306 to laser 310. If the data signal is a logic low, switch 312 is closed and the $I_{MOD}$ current from $I_{MOD}$ and $I_{BIAS}$ current source 302 passes through inductor 306 and switch 312 and is sinked by $I_{MOD}$ current sink 316. This leaves $I_{BIAS}$ from $I_{MOD}$ and $I_{BIAS}$ current source 302 to pass through inductor 306 to laser 310. Therefore, for a logic high data signal, laser 310 receives both the $I_{MOD}$ and $I_{BIAS}$ currents, and for a logic low data signal, laser 310 receives the $I_{BIAS}$ current.

Figure 4:
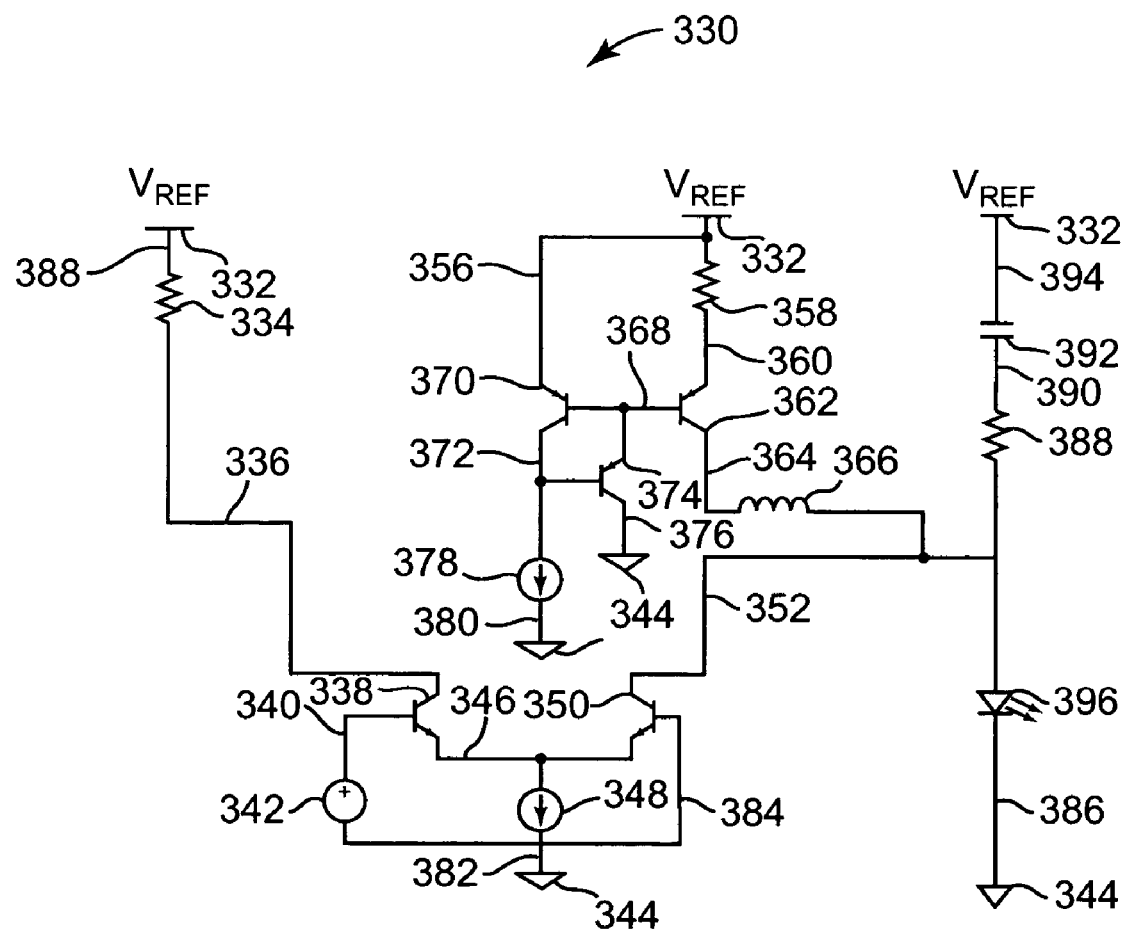
FIG. 4 is a schematic diagram illustrating one embodiment of a single ended laser driver coupled to a laser.

FIG. 4 is a schematic diagram illustrating one embodiment of a single ended laser driver with laser circuit 330 for portion 300 of transceiver 100. Single ended laser driver with laser circuit 330 includes resistors 334, 358, and 388, PNP transistors 370, 362, and 374, inductor 366, current sources 378 and 348, NPN transistors 338 and 350, capacitor 393, control signal source 342, and laser diode 396.

Resistor 334 is electrically coupled to reference voltage ($V_{REF}$) 332 through path 388 and to the collector of NPN transistor 338 through path 336. The base of transistor 338 is electrically coupled to control signal source 342 through path 340. The emitter of transistor 338 is electrically coupled to the emitter of transistor 350 and to current source 348 through path 346. Current source 348 is electrically coupled to a ground or common 344 through path 382. Control signal source 342 is electrically coupled to the base of transistor 350 through path 384. The collector of transistor 350 is electrically coupled to inductor 366, the anode of laser diode 396, and resistor 388 through path 352. The cathode of laser diode 396 is electrically coupled to common 344 through path 386. Resistor 388 is electrically coupled to capacitor 392 through path 390 and capacitor 392 is electrically coupled to $V_{REF}$ 332 through path 394.

Inductor 366 is electrically coupled to the collector of transistor 362 through path 364. The emitter of transistor 362 is electrically coupled to resistor 358 through path 360. The base of transistor 362 is electrically coupled to the emitter of transistor 374 and the base of transistor 370 through path 368. The collector of transistor 374 is electrically coupled to common 344 through path 376. The base of transistor 374 is electrically coupled to the collector of transistor 370 and to current source 378 through path 372. Current source 378 is electrically coupled to common 344 though path 380. The emitter of transistor 370 is electrically coupled to $V_{REF}$ signal 332 and resistor 358 through path 356.

$V_{REF}$ 332, resistor 358, PNP transistors 362, 370, and 374, and current source 378 provide $I_{MOD}$ and $I_{BIAS}$ current source 302. Inductor 366 is similar to inductor 306. NPN transistors 338 and 350 and control signal source 342 provide switch 312. Current source 348 provides $I_{MOD}$ current sink 316. Laser diode 396 provides laser 310.

Current source 378, $V_{REF}$ 332, transistors 370, 374, and 362, and resistor 358 form a current mirror. The current mirror provides a current on path 364, which passes to inductor 366. The current on path 364 is approximately equal to the current of current source 378. Current source 378 supplies a current equal to approximately the $I_{BIAS}$ and $I_{MOD}$ current. Inductor 366 improves the frequency response of the current mirror by increasing the bandwidth of the current mirror. Inductor 366 can be sized to achieve a desired frequency response and to reduce the intersymbol interference of the optical output of laser diode 396 to a desired level.

Control signal source 342 controls transistor 338 and transistor 350 by activating or deactivating the transistors. If transistor 338 is turned on (conducting), then transistor 350 is turned off (not conducting). If transistor 350 is turned on, then transistor 338 is turned off. If transistor 338 is turned on, current passes from $V_{REF}$ 332 through resistor 334 and through transistor 338 and current source 348 to common 344. With transistor 350 off, both the $I_{MOD}$ current and the $I_{BIAS}$ current pass through laser diode 396.

If transistor 350 is on, some current passes through laser diode 396 from the current mirror and some current passes through transistor 350 through path 352. The current that passes through laser diode 396 is the $I_{BIAS}$ current and the current that passes through transistor 350 is the $I_{MOD}$ current, which is sunk by current source 348.

In operation, control signal source 342 switch transistors 338 and 350 on or off based on a data signal. For a logic high in the data signal, output transistor 338 is turned on by control signal source 342 and transistor 350 is turned off. In this case, current source 348 sinks a current from $V_{REF}$ and resistor 334 to common 344. With transistor 350 off, the $I_{MOD}$ and $I_{BIAS}$ current from the current mirror passes through inductor 366 and through laser diode 396 to common 344. Laser diode 396 outputs a logic high optical signal.

For a logic low in the data signal, output transistor 350 is turned on by control signal source 342 and transistor 338 is turned off. In this case, current source 348 sinks the $I_{MOD}$ current from the current mirror. With transistor 350 turned on, the $I_{BIAS}$ current passes through laser diode 396 to common 344. Laser diode 396 outputs a logic low optical signal.

In one embodiment, all the components of single ended laser diode with laser circuit 330, except laser diode 396, are fabricated as a single semiconductor chip.

Figure 5:
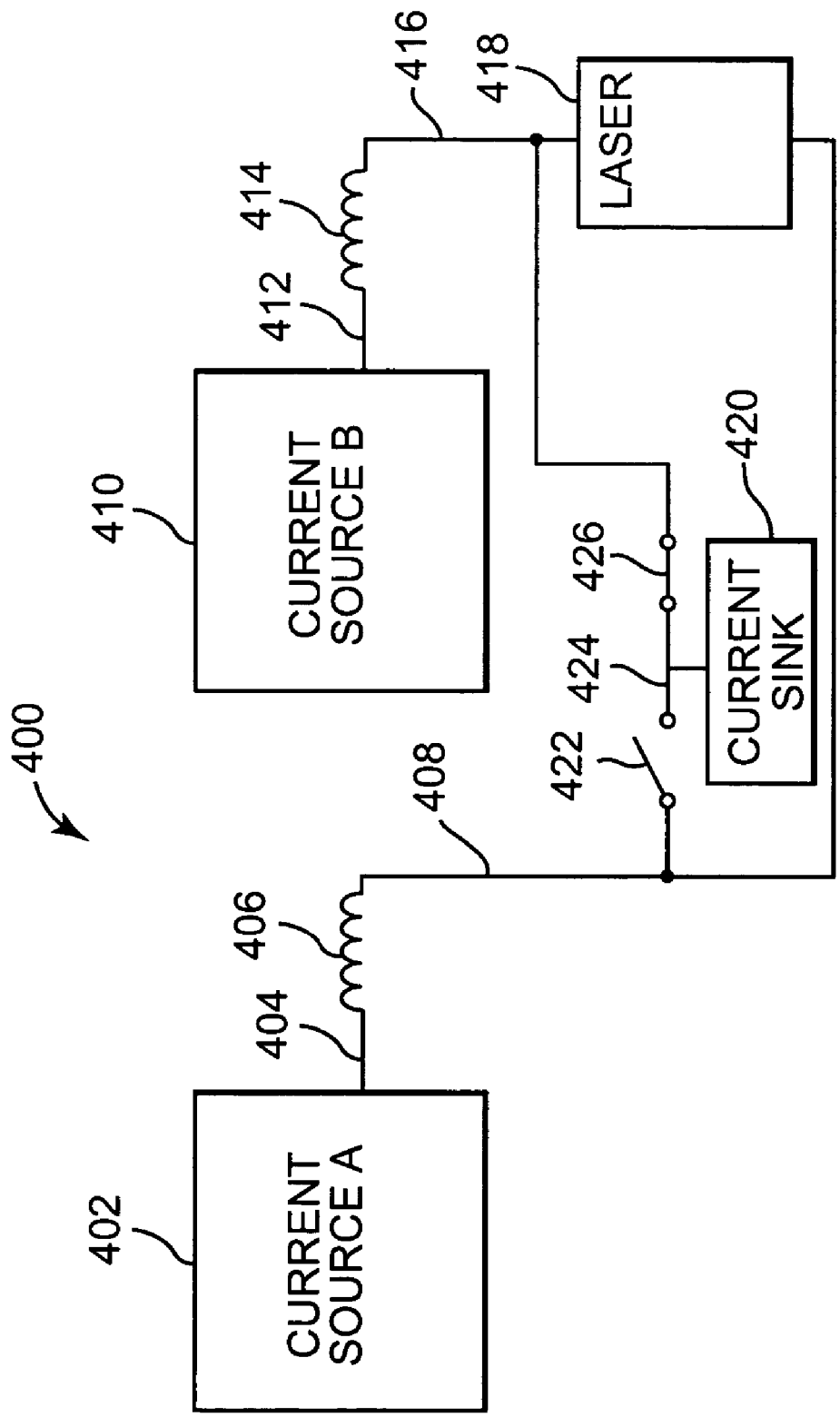
FIG. 5 is a diagram illustrating one embodiment of a differential laser driver coupled to a laser.

FIG. 5 is a diagram illustrating another embodiment of a portion 400 of transceiver 100 including a differential laser driver coupled to a laser. Portion 400 of transceiver 100 includes current source A 402, current source B 410, current sink 420, inductor 406, inductor 414, switch 422, switch 426, and laser 418. Current source A 402 is electrically coupled to inductor 406 through path 404. Inductor 406 is electrically coupled to switch 422 and laser 418 through path 408. Switch 422 is electrically coupled to switch 426 and current sink 420 through path 424. Switch 426 is electrically coupled to laser 418 and inductor 414 through path 416. Inductor 414 is electrically coupled to current source B 410 through path 412.

Current source A 402 includes a PNP transistor current source and provides a source current ($A_{OUT}$). Current source B 410 includes a PNP transistor current source and provides a source current ($B_{OUT}$). Current source A 402 and current source B 410 are selected based on the $I_{MOD}$ and $I_{BIAS}$ current requirements of laser 418. Current sink 420 provides a sink current ($C_{OUT}$). Current sink 420 is selected based on the $I_{MOD}$ current requirements of laser 418. The source current $A_{OUT}$ of current source A 402 is equal to $B_{OUT}-I_{BIAS}-\frac{1}{2} I_{MOD}$. The source current $B_{OUT}$ of current source B 402 is equal to $A_{OUT}+I_{BIAS}+\frac{1}{2} I_{MOD}$. The sink current $C_{OUT}$ of current sink 420 is equal to $\frac{1}{2} I_{MOD}$.

To increase the frequency response of current source B 410, the signal from current source B 410 passes through inductor 414 before the signal is passed to laser 418. To increase the frequency response of current source A 402, the signal from current source A 402 passes through inductor 406 before the signal is passed to laser 418. Inductor 414 and inductor 406 can be sized to achieve a desired frequency response and to reduce the intersymbol interference of the optical output of laser 418 to a desired level.

Switches 422 and 426 are NPN transistors serving as high speed switches or switches 422 and 426 are other suitable switches. Switches 422 and 426 switch on and off in response to a data signal and have opposite states. If switch 422 is open, switch 426 is closed, and if switch 422 is closed, switch 426 is open. A logic low in the data signal closes switch 426 and opens switch 422 and a logic high in the data signal opens switch 426 and closes switch 422. Laser 418 outputs a logic low optical signal if switch 426 is closed and outputs a logic high optical signal if switch 426 is open. Laser 418 is a laser diode or other suitable laser.

In operation, if the data signal is a logic high, switch 426 is opened and switch 422 is closed. In this case, the current through laser 418 is defined as $B_{OUT}-(A_{OUT}-C_{OUT})$. Substituting $A_{OUT}+I_{BIAS}+\frac{1}{2} I_{MOD}$ for $B_{OUT}$ and $\frac{1}{2} I_{MOD}$ for $C_{OUT}$ results in $(A_{OUT}+I_{BIAS}+\frac{1}{2} I_{MOD})-A_{OUT}+\frac{1}{2} I_{MOD}$. Simplifying the equation results in $I_{BIAS}+I_{MOD}$ passing through laser 418. Therefore, for a logic high data signal, laser 418 receives the $I_{MOD}$ and $I_{BIAS}$ currents.

If the data signal is a logic low, switch 426 is closed and switch 422 is opened. In this case, the current through laser 418 is defined as $B_{OUT}-C_{OUT}-A_{OUT}$. Substituting $A_{OUT}+I_{BIAS}+\frac{1}{2} I_{MOD}$ for $B_{OUT}$ and $I_{MOD}$ for $C_{OUT}$ results in $(A_{OUT}+I_{BIAS}+\frac{1}{2} I_{MOD})-\frac{1}{2} I_{MOD}-A_{OUT}$. Simplifying the equation results in $I_{BIAS}$ passing through laser 418. Therefore, for a logic low data signal, laser 418 receives the $I_{BIAS}$ current.

Figure 6:
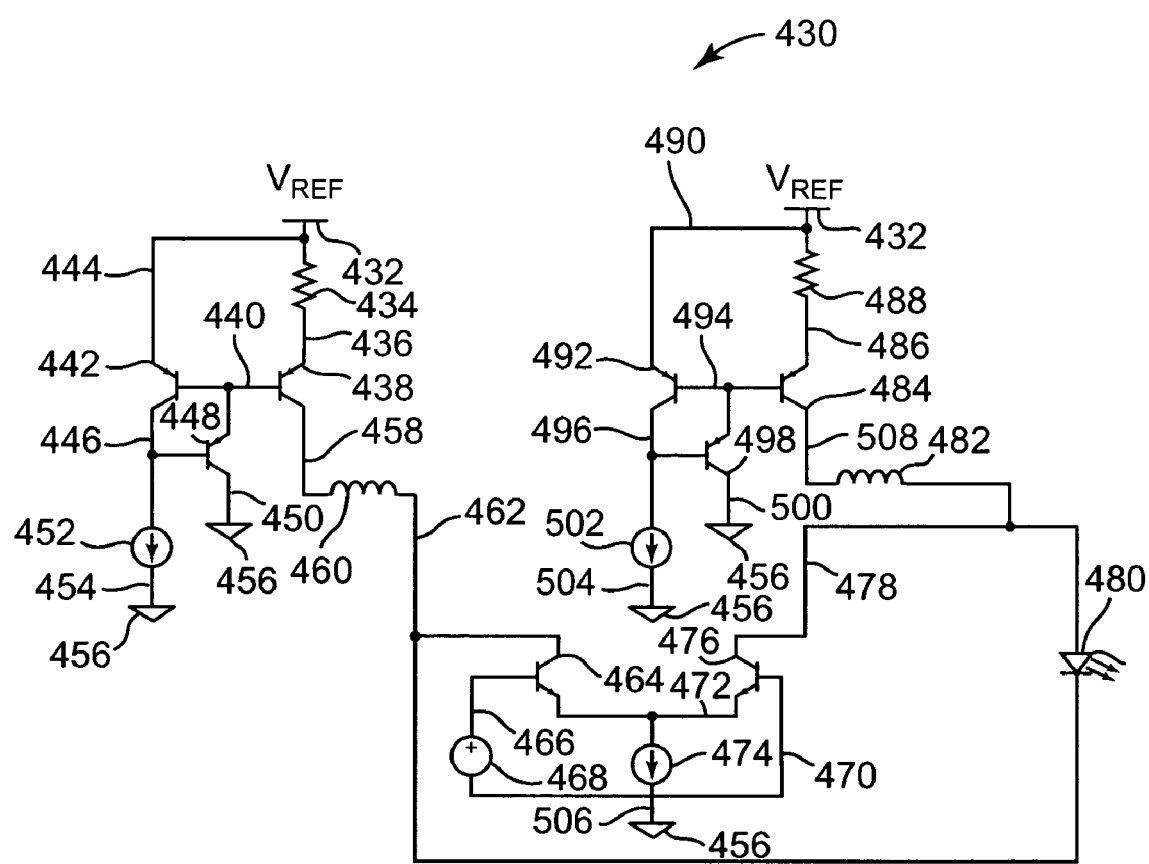
FIG. 6 is a schematic diagram illustrating one embodiment of a differential laser driver coupled to a laser.

FIG. 6 is a schematic illustrating one embodiment of a differential laser driver with laser circuit 430 for portion 400 of transceiver 100. Differential laser driver with laser circuit 430 includes resistors 434 and 488, PNP transistors 442, 438, 448, 492, 484, and 498, inductors 460 and 482, current sources 452, 502, and 474, control signal source 468, NPN transistors 464 and 476, and laser diode 480.

Resistor 434 is electrically coupled to reference voltage ($V_{REF}$) 432 and the emitter of transistor 442 through path 444. The base of transistor 442 is electrically coupled to the base of transistor 438 and the emitter of transistor 448 through path 440. The collector of transistor 442 is electrically coupled to the base of transistor 448 and to current source 452 through path 446. Current source 452 is electrically coupled to common 456 through path 454. The collector of transistor 448 is electrically coupled to common 456 through path 450. The emitter of transistor 438 is electrically coupled to resistor 434 through path 436. The collector of transistor 438 is electrically coupled to inductor 460 through path 458.

Inductor 460 is electrically coupled to the collector of transistor 464 and the cathode of laser diode 480 through path 462. The base of transistor 464 is electrically coupled to the control signal source 468 through path 466. The emitter of transistor 464 is electrically coupled to the emitter of transistor 476 and to current source 474 through path 472. Current source 474 is electrically coupled to common 456 through path 506. The base of transistor 476 is electrically coupled to control signal source 468 through path 470. The collector of transistor 476 is electrically coupled to the anode of laser diode 480 and inductor 482 through path 478.

Inductor 482 is electrically coupled to the collector of transistor 484 through path 508. The base of transistor 484 is electrically coupled to the emitter of transistor 498 and the base of transistor 492 through path 494. The emitter of transistor 484 is electrically coupled to resistor 488 through path 486. The resistor 488 is electrically coupled to $V_{REF}$ 432 and the emitter of transistor 492 through path 490. The collector of transistor 492 is electrically coupled to the base of transistor 498 and current source 502 through path 496. The collector of transistor 498 is electrically coupled to common 456 through path 500. Current source 502 is electrically coupled to common 456 through path 504.

$V_{REF}$ 432, transistors 442, 438, and 448, current source 452, and resistor 434 provide current source A 402. Inductor 460 is similar to inductor 406. $V_{REF}$ 432, transistors 492, 484, and 498, current source 502, and resistor 488 provide current source B 410. Inductor 482 is similar to inductor 414. Transistor 464 provides switch 422, transistor 476 provides switch 426, and data signal source 468 controls transistors 464 and 476. Current source 474 provides current sink 420. Laser diode 480 provides laser 418.

Current source 502, $V_{REF}$ 432, transistors 492, 484, and 498, and resistor 488 form a current mirror. The current mirror provides a current on path 508, which passes to inductor 482. The current on path 508 is approximately equal to the current of current source 502. Current source 502 is approximately equal to $A_{OUT}+I_{BIAS}+\frac{1}{2}I_{MOD}$. Inductor 482 improves the frequency response of the current mirror by increasing the bandwidth of the current mirror. Inductor 482 can be sized to achieve the desired frequency response and to reduce the intersymbol interference of the optical output of laser diode 480 to a desired level.

Current source 452, $V_{REF}$ 432, transistors 442, 438, and 448, and resistor 434 form a current mirror. The current mirror provides a current on path 458, which passes to inductor 460. The current on path 458 is approximately equal to the current of current source 452. Current source 452 is approximately equal to $B_{OUT}-I_{BIAS}-\frac{1}{2}I_{MOD}$. Inductor 460 improves the frequency response of the current mirror by increasing the bandwidth of the current mirror. Inductor 460 can be sized to achieve the desired frequency response and to reduce the intersymbol interference of the optical output of laser diode 480 to a desired level.

Control signal source 468 controls transistor 464 and transistor 476 by activating or deactivating the transistors. If transistor 464 is turned on (conducting), then transistor 476 is turned off (not conducting). If transistor 476 is turned on, then transistor 464 is turned off. With transistor 476 off and transistor 464 on, both the $I_{MOD}$ current and the $I_{BIAS}$ current pass through laser diode 480. With transistor 476 on and transistor 464 off, the $I_{BIAS}$ current passes through laser diode 480.

In operation, control signal source 468 switches transistors 464 and 476 on or off based on a data signal. For a logic high in the data signal, transistor 464 is turned on by control signal source 468 and transistor 476 is turned off. In this case, the current through laser diode 480 equals $B_{OUT}-(A_{OUT}-C_{OUT})$ as previously defined. The resulting $I_{BIAS}+I_{MOD}$ current passes through laser diode 480. Laser diode 480 outputs a logic high optical signal.

For a logic low in the data signal, transistor 476 is turned on by control signal source 468 and transistor 464 is turned off. In this case, the current through laser diode 480 equals $B_{OUT}-C_{OUT}-A_{OUT}$ as previously defined. The resulting $I_{BIAS}$ current passes through laser diode 480. Laser diode 480 outputs a logic low optical signal.

In one embodiment, all the components of differential laser driver with laser circuit 430, except for laser diode 480, are fabricated on a single semiconductor chip.

What is claimed is:

1. A laser driver comprising:
   a first PNP transistor current source coupled to a first inductor, the first inductor coupled to a first side of a laser diode;
   a second PNP transistor current source coupled to a second inductor, the second inductor coupled to a second side of the laser diode;
   a first switch coupled to the first inductor;
   a second switch coupled to the second inductor;
   a control signal source that controls the first switch and the second switch according to a data signal such that the first switch is open when the second switch is closed and such that the first switch is closed when the second switch is open; and
   a current sink coupled to the first side of the laser diode when the first switch is closed and to the second side of the laser diode when the second switch is closed, wherein the first PNP transistor current source and the first inductor and the second PNP transistor current source and the second inductor and the current sink provide:
      a first current to the laser diode when the first switch is closed and the second switch is open; and
      a second current to the laser diode when the first switch is open and the second switch is closed.

2. The laser driver of claim 1, wherein the first PNP transistor current source comprises a first PNP transistor current mirror and the second PNP transistor current source comprises a second PNP transistor current mirror.

3. The laser driver of claim 1, wherein the first switch and the second switch operate in response to a data signal.

4. The laser driver of claim 3, wherein the data signal sets an output of the laser diode to one of a logic high optical signal and a logic low optical signal.

5. The laser driver of claim 1, wherein the first inductor and the second inductor are sized to reduce intersymbol interference of an output of the laser diode to a desired level.

6. The laser driver of claim 1, wherein the first PNP transistor current source, the second PNP transistor current source, the first switch, the second switch, the first inductor, the second inductor, and the current sink are on a single semiconductor chip.

7. A method for driving a laser comprising:
receiving a data signal;
operating a first switch and a second switch in response to the data signal; and
supplying a first differential current to a laser when the first switch is closed and the second switch is open and supplying a second differential current to the laser when the first switch is open and the second switch is closed, wherein the first differential current and the second differential current are supplied to the laser by a first PNP transistor current source through a first inductor to a first side of the laser and from a second PNP transistor current source through a second inductor to a second side of the laser and from a current sink, wherein the current sink is connected to both the first switch and the second switch, and is connected to the first side of the laser through the first switch when the first switch is closed and to the second side of the laser through the second switch when the second switch is closed.

8. The method of claim 7, wherein the first differential current comprises a bias current and a modulation current.

9. The method of claim 7, wherein the second differential current comprises a bias current.

10. The method of claim 7, wherein the first switch comprises a first transistor switch and the second switch comprises a second transistor switch.

11. The method of claim 10, wherein the first transistor switch comprises a first NPN transistor switch and the second transistor switch comprises a second NPN transistor switch.

12. The method of claim 7, wherein the first switch is closed and the second switch is open to drive the laser to output a logic low optical signal and the first switch is opened and the second switch is closed to drive the laser to output a logic high optical signal.

13. The method of claim 7, wherein the first PNP transistor current source comprises a first PNP transistor current mirror and the second PNP transistor current source comprises a second PNP transistor current mirror.

* * * * *

UNITED STATES PATENT AND TRADEMARK OFFICE
CERTIFICATE OF CORRECTION

PATENT NO.       : 7,411,986 B2                                                     Page 1 of 1
APPLICATION NO.  : 10/808952
DATED            : August 12, 2008
INVENTOR(S)      : Diaz It is certified that error appears in the above-identified patent and that said Letters Patent is hereby corrected as shown below:

Column 4
Line 63, change "capacitor 393," to --capacitor 392,--

Column 6
Line 66, change "$I_{MOD}$ for $C_{OUT}$ results" to --½ $I_{MOD}$ for $C_{OUT}$ results--

Column 8
Line 3, change "½ $I_{MOD}$ Inductor 460" to --½ $I_{MOD}$. Inductor 460--

Signed and Sealed this

Seventh Day of September, 2010

David J. Kappos
*Director of the United States Patent and Trademark Office*